(12) United States Patent
Tolles et al.

(10) Patent No.: US 7,754,519 B1
(45) Date of Patent: Jul. 13, 2010

(54) METHODS OF FORMING A PHOTOVOLTAIC CELL

(75) Inventors: Robert D. Tolles, San Jose, CA (US); Aditya Agarwal, Sunnyvale, CA (US); Orion Leland, Fremont, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 12/465,351

(22) Filed: May 13, 2009

(51) Int. Cl.
*H01L 21/00* (2006.01)
*H01L 21/46* (2006.01)

(52) U.S. Cl. .............................. 438/57; 438/72; 438/73; 438/66; 438/97; 438/458; 136/244; 136/252; 136/258; 136/261; 257/E21.001; 257/E21.122; 257/E21.568; 257/E31.032; 257/E31.04

(58) Field of Classification Search .......... 257/E21.001, 257/E21.122, E21.568, E31.032, E31.04
See application file for complete search history.

(56) References Cited

U.S. PATENT DOCUMENTS

| 6,146,979 | A | 11/2000 | Henley et al. | |
|---|---|---|---|---|
| 7,399,681 | B2 | 7/2008 | Couillard et al. | |
| 2007/0277874 | A1 | 12/2007 | Dawson-Elli et al. | |
| 2008/0070340 | A1* | 3/2008 | Borrelli et al. | 438/57 |
| 2009/0142874 | A1* | 6/2009 | Arai | 438/57 |
| 2009/0197368 | A1* | 8/2009 | Sivaram et al. | 438/73 |
| 2009/0242031 | A1* | 10/2009 | Herner et al. | 136/261 |

OTHER PUBLICATIONS

Sivaram et al., U.S. Appl. No. 12/026,530, "Method to Form a Photovoltaic Cell Comprising a Thin Lamina," filed Feb. 5, 2008.
Herner, U.S. Appl. No. 12/057,265, "Method to Form a Photovoltaic Cell Comprising a Thin Lamina Bonded to a Discrete Receiver Element," filed Mar. 27, 2008.
Agarwal et. al, U.S. Appl. No. 12/335,479, filed Dec. 15, 2008, "Methods of Transferring a Lamina to a Receiver Element".
Herner, U.S. Appl. No. 12/343,420, filed Dec. 23, 2008, titled "Method to Texture a Lamina Surface Within a Photovoltaic Cell".
Parrill et al., U.S. Appl. No. 12/122,108, "Ion Implanter for Photovoltaic Cell Fabrication," filed May 16, 2008.
Petti et al., "Front Connected Photovoltaic Assembly," U.S. Appl. No. 12/331,376, filed Dec. 9, 2008.

* cited by examiner

*Primary Examiner*—Charles D Garber
*Assistant Examiner*—Mohsen Ahmadi
(74) *Attorney, Agent, or Firm*—The Mueller Law Office, P.C.

(57) ABSTRACT

In some embodiments, a method of forming a photovoltaic cell includes (1) forming a cleave plane in a donor body so as to define a lamina to be bonded to a receiver element and exfoliated from the donor body; (2) prior to bonding, pre-heating the donor body without the receiver element to a temperature of greater than about 200° C. for a first time period that is less than a time period required for exfoliation of the lamina from the donor body; (3) cooling the donor body after pre-heating the donor body; (4) bonding the donor body to the receiver element; and (5) heating the bonded donor body and receiver element for a second time period so as to complete the exfoliation of the lamina from the donor body. Numerous other aspects are provided.

9 Claims, 6 Drawing Sheets

METHODS OF FORMING A PHOTOVOLTAIC CELL

FIELD OF THE INVENTION

The present invention relates to solar cell technology, and more particularly to methods of forming a photovoltaic cell.

BACKGROUND

Conventional photovoltaic cells are commonly formed of silicon wafers. Decades of research have been dedicated to developing processes for and understanding the properties of such wafers.

Current technology does not allow silicon wafers of less than about 170 microns in thickness to be fabricated economically. Silicon solar cells need not be this thick to be effective or commercially useful. As such, a large portion of the cost of a conventional solar cell is the cost of silicon feedstock that is not required for solar cell operation.

There is a need, therefore, for methods of forming photovoltaic cells from silicon more economically.

SUMMARY OF THE INVENTION

In some embodiments of the invention, a method of forming a photovoltaic cell includes (1) forming a cleave plane in a donor body so as to define a lamina to be bonded to a receiver element and exfoliated from the donor body; (2) prior to bonding, pre-heating the donor body without the receiver element to a temperature of greater than about 200° C. for a first time period that is less than a time period required for exfoliation of the lamina from the donor body; (3) cooling the donor body after pre-heating the donor body; (4) bonding the donor body to the receiver element; and (5) heating the bonded donor body and receiver element for a second time period so as to complete the exfoliation of the lamina from the donor body.

In other embodiments of the invention, a method includes (1) forming a cleave plane in a donor body so as to define a lamina to be bonded to a receiver element and exfoliated from the donor body; (2) pre-heating the donor body in a first chamber for a first time period that is less than a time period required for exfoliation of the lamina from the donor body; (3) after pre-heating the donor body, removing the donor body from the first chamber; (4) bonding the donor body to the receiver element; and (5) heating the bonded donor body and receiver element for a second time period so as to complete the exfoliation of the lamina from the donor body.

In still other embodiments of the invention, a method of forming a photovoltaic cell includes (1) providing a semiconductor donor body; (2) implanting a species into the donor body so as to form a cleave plane in the donor body, the cleave plane defining a lamina to be bonded to a receiver element and exfoliated from the donor body; (3) pre-heating the donor body in a first chamber for a first time period that is less than a time period required for exfoliation of the lamina from the donor body; (4) after pre-heating the donor body, removing the donor body from the first chamber; (5) bonding the donor body to the receiver element; and (6) heating the bonded donor body and receiver element for a second time period so as to complete the exfoliation of the lamina from the donor body. The first time period is at least as long as the second time period. Numerous other aspects are provided in accordance with these and other embodiments of the invention.

Other features and aspects of the present invention will become more fully apparent from the following detailed description, the appended claims and the accompanying drawings.

DETAILED DESCRIPTION

A typical silicon wafer used to form a photovoltaic cell is about 200 to about 250 microns thick. It is known to slice silicon wafers as thin as about 180 microns, but such wafers are fragile and prone to breakage.

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference herein in its entirety for all purposes, describe fabrication of a photovoltaic cell that includes a thin semiconductor lamina formed of non-deposited semiconductor material. In some embodiments, such thin semiconductor lamina may be only on the order of about 0.2 to about 100 microns thick.

To form such a thin semiconductor lamina, a semiconductor donor body is implanted with one or more species of gas ions, for example hydrogen and/or helium ions. The implanted ions define a cleave plane within the semiconductor donor body. The donor body then is bonded to a receiver element that will provide structural support for the lamina following an anneal process which causes the lamina to cleave or "exfoliate" from the donor body at the cleave plane. A photovoltaic cell then may be fabricated using the bonded lamina and receiver element. In some embodiments, the receiver element may be a discrete receiver element having a maximum width no more than 50 percent greater than that of the donor body, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference.

Using the methods of Sivaram et al., photovoltaic cells are formed of thinner semiconductor laminae without wasting silicon through kerf loss or by fabrication of an unnecessarily thick cell, thus reducing cost. The same donor body can be reused to form multiple laminae, further reducing cost.

To ensure that a lamina is not exfoliated from a donor body before the lamina is bonded to a receiver element, the annealing step used to drive exfoliation is typically performed after bonding. Such an exfoliation process may take up to several hours. To reduce photovoltaic cell costs, it is desirable to use an inexpensive receiver element such as soda lime glass (SLG). However, SLG and similar materials have a coefficient of thermal expansion that is not well matched to that of a silicon wafer. When such materials are used for the receiver element, the receiver element and donor body are not cooled following bonding until exfoliation is complete (e.g., to avoid undue stress on the receiver element, donor body and/or lamina due to the coefficient of thermal expansion mismatch between the receiver element and donor body). Once the lamina is exfoliated from the donor body, the lamina is thin enough to accommodate the different contraction rates during cooling between the lamina and receiver element due to the coefficient of thermal expansion mismatch. In these cases, exfoliation generally is performed within the bonder used to bond the receiver element and donor body while the bonded receiver element and donor body are held at or near the bonding temperature. A typical bonder bonds a single wafer at a time, so using a bonder for an exfoliation anneal is inefficient. Accordingly, producing a large number of laminae may be time consuming and expensive, and may require numerous bonders to be operated in parallel.

In accordance with one or more embodiments of the present invention, a pre-heating step is performed on an implanted donor body before the donor body is bonded to a receiver element. Such a pre-heating step may be performed in a single wafer chamber or a batch chamber. The pre-heating step may be performed at the same or at a different location or facility than is employed for bonding and/or post bonding exfoliation. In some embodiments, following pre-heating, the pre-heated, implanted donor body may be immediately bonded. In other embodiments, the pre-heated, implanted donor body may be stored for some time period, such as for hours, days, weeks or more until needed. In this manner, the number of donor bodies stored locally near a bonding and/or exfoliation tool as work in progress (WIP) may be reduced. Such a pre-heating step may also reduce the time a donor body spends in a bonder such as a bonding chamber or other bonding station or location, particularly when exfoliation of a lamina from the donor body is performed within the bonder. In general, the pre-heating step may be performed for any suitable duration and at any suitable temperature. However, in some embodiments, the pre-heating step is performed for at least half of the anneal time required for exfoliation Overall throughput of the lamina exfoliation process may be significantly increased.

As an example, in some embodiments, numerous donor bodies previously implanted with one or more species of gas ions so as to define a cleave plane within each donor body may be pre-heated in a batch chamber, such as an oven, quartz furnace, belt furnace, other similar heater, etc., so that the lamina exfoliation process for each donor body after bonding is shortened (e.g., preferably significantly shortened). After being pre-heated, each donor body may be transferred to a bonder such as a bonding chamber or other bonding station/location and bonded to a receiver element. The remainder of the exfoliation heating process may be performed within the bonder or a separate heating chamber. In either case, the amount of time spent within the bonder and/or performing post-bonding exfoliation may be significantly reduced. These and other aspects of the invention are described below with reference to FIGS. 1A-4E.

Exemplary Lamina Exfoliation Process

Figure 1A:
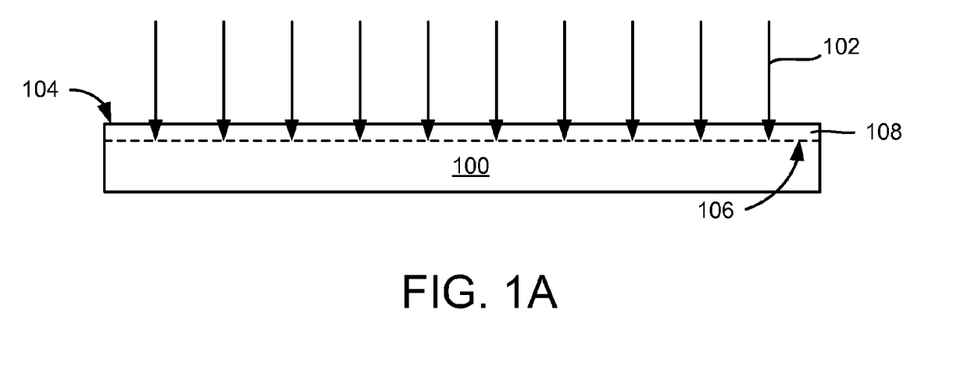
FIGS. 1A-1D are cross-sectional views showing stages of formation of a lamina of a donor body in accordance with an embodiment of the present invention.

With reference to FIG. 1A, a donor body 100 is provided. The donor body 100 may be formed from any suitable material such silicon, germanium, silicon germanium, III-V or II-VI compounds, or the like, and may be monocrystalline, polycrystalline, microcrystalline, multicrystalline, etc. For convenience, the present invention will be described primarily with reference to a monocrystalline silicon donor body.

As shown in FIG. 1A, one or more species of gas ions 102 are implanted through a surface 104 of the donor body 100 to define a cleave plane 106 within the donor body 100. The gas ions 102 may include hydrogen and/or helium, for example, or any other suitable species.

As the gas ions 102 pass through the donor body 100, the gas ions 102 are slowed by electronic interactions and collisions with atoms in the lattice of the donor body 100. The gas ions 102 are implanted to a distribution of implant depths within this lattice, some deeper, some shallower, and this distribution of implant depths has a maximum concentration at some depth below the surface 104 of the donor body 100. The gas ions 102 produce damage in the lattice of the donor body 100 at a distribution of depths, and have a depth of maximum concentration which defines the cleave plane 106. The cleave plane 106 sets a thickness of a lamina 108, which is the portion of the donor body 100 to be exfoliated from the donor body 100.

Additional details of gas ion generation and implantation of gas ions to form a cleave plane within a donor body may be found in Sivaram et al., U.S. patent application Ser. No. 12/026,530 cited above.

Figure 1B:
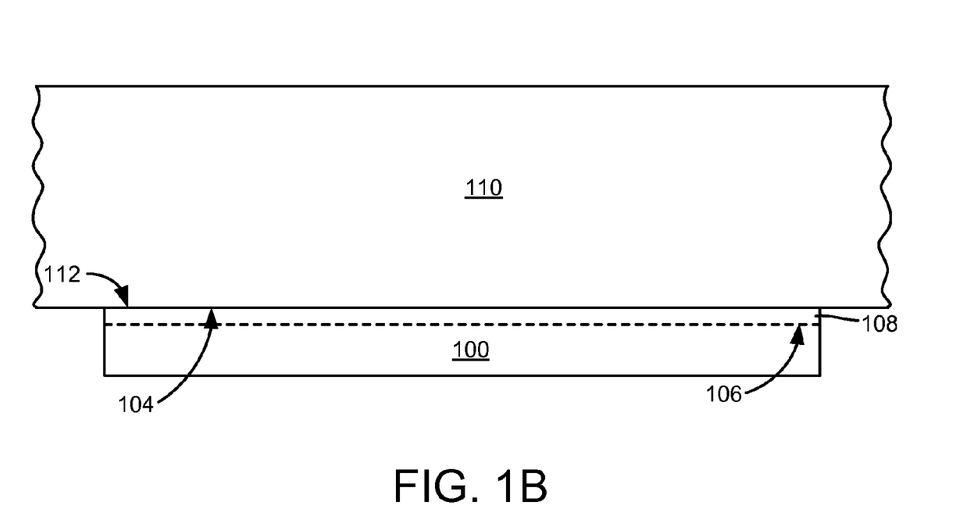

To exfoliate the lamina 108 from the donor body 100, the donor body 100 is heated to an elevated temperature so as to cause implanted gas ions 102 to diffuse to the cleave plane 106, forming bubbles or micro-cracks. These bubbles or micro-cracks expand and merge, eventually causing the lamina 108 to separate from the remainder of the donor body 100. Such an exfoliation process is typically performed with a receiver element in contact with and/or bonded to the donor body 100. For example, FIG. 1B illustrates the donor body 100 in contact with a receiver element 110 (e.g., glass, such as soda-lime glass or Pyrex; a metal or metal alloy such as stainless steel or aluminum; a polymer; or a semiconductor, such as metallurgical grade silicon, or the like). When SLG or another similar receiver element with a mismatched coefficient of thermal expansion is employed, the receiver element and donor body are not cooled following bonding until exfoliation is complete (e.g., to avoid undue stress on the receiver element, donor body and/or lamina due to the coefficient of thermal expansion mismatch). In these cases, exfoliation generally is performed within a bonder while the bonded receiver element and donor body are held at or near the bonding temperature.

Having the receiver element 110 in contact with the donor body 100 during exfoliation forces micro-cracks that form at the cleave plane 106 to expand sideways, forming a continuous split along the cleave plane 106, rather than expanding perpendicularly to the cleave plane 106 prematurely. The lamina 108 is bonded to the receive element 110 prior to separation from the donor body 100 to ensure that the lamina 108 is supported and/or not damaged during separation from the donor body 100. For the above reason, exfoliation is typically performed with the donor body 100 in contact with and bonded to the receiver element 110. As stated, such an exfoliation process may take up to several hours, depending on the temperature at which it is performed.

In accordance with one or more embodiments of the present invention, at least a portion of the exfoliation heating process is performed prior to bonding and/or without the receiver element being present. For example, after implantation, the donor body 100 may be "pre-heated" at an elevated temperature for a time period that is less than the time period required for exfoliation of the lamina 108 from the donor body 100. The donor body 100 may be pre-heated in a batch chamber, such as a quartz furnace, belt furnace, an oven, etc., with one or more other donor bodies at a temperature and for a time period less than is required for exfoliation of the lamina 108 from the donor body 100. The receiver element 110 need not be present during such a pre-heating step. By pre-heating the donor body 100, at least a portion of the exfoliation process may be performed before bonding in an inexpensive batch chamber. When a receiver element with a mismatched coefficient of thermal expansion is employed, such as SLG, and exfoliation is performed in a bonder, such a pre-heating step may reduce the time the bonded receiver element/donor body spends in the bonder. In this manner, a donor body may spend significantly less time in a bonder and overall throughput of the lamina exfoliation process is increased.

In some embodiments, the pre-heating step may be performed at a temperature of greater than about 200° C., for example, in the range from about 350 to about 650° C. preferably about 350 to about 500° C., for about 5 minutes to about 4 hours and more preferably in a temperature range of about 400 to about 475° C. for about 60 minutes or less. The pre-heating step may be performed in a nitrogen, argon, other inert and/or non-reactive environment or any other suitable environment. The pre-heating step is a separate step from any post-implant/pre-bonding processing used to form a photovoltaic cell and that may elevate the temperature of the donor body 100 such as post-implant/pre-bonding metallization, oxidation, patterning, etc. Unlike the above described pre-heating step, these post-implant/pre-bonding processing steps are not performed for the purpose of shortening the post-bonding exfoliation process. The pre-heating step is a heating step only, not a metallization, oxidation, deposition, doping, etching, patterning or similar processing step.

Following pre-heating, the donor body 100 may be cooled and/or transferred to a bonding or other chamber and heated to complete the exfoliation and/or bonding process. For example, following pre-heating, the donor body 100 may be heated to about a bonding temperature and the receiver element 110 may be heated to about the bonding temperature. As described in commonly assigned Agarwal et. al, U.S. patent application Ser. No. 12/335,479, filed Dec. 15, 2008, "Methods of Transferring a Lamina to a Receiver Element", which is hereby incorporated by reference herein in its entirety for all purposes, the donor body 100 and the receiver element 110 may be generally separate from one another while the donor body 100 and the receiver element 110 are heated to at or near the bonding temperature so as to reduce the effects of any mismatch between the coefficients of thermal expansion of the donor body 100 and the receiver element 110. This is particularly useful when the receiver element 110 is SLG or another similar material with a largely mismatched coefficient of thermal expansion relative to that of the donor body 100. As an example, the bonding temperature used following the pre-heating step may be about 350 to about 500° C., and more preferably about 400 to about 475° C. In general, the temperature used for the pre-heating step may be the same, greater than or less than the temperature used during the subsequent bonding and/or exfoliation processes.

When both the donor body 100 and the receiver element 110 are at about the bonding temperature, the surface 104 of the donor body 100 may be generally biased against a surface 112 of the receiver element 110, and, for example, subjected to about 500V or another suitable voltage to form an anodic bond between the donor body 100 and the receiver element 110 (FIG. 1B). (Alternatively, the bond may be formed by another method such as by thermo-compression of the donor body 100 and receiver element 110, fusion bonding, plasma-activated fusion bonding, use of an adhesive layer, or the like.) The donor body 100 then becomes bonded to the receiver element 110 under the influence of the bias, while both the donor body 100 and the receiver element 110 are at the bonding temperature. After bonding the donor body 100 to the receiver element 110, the receiver element 110 and the donor body 100 are maintained at an exfoliation temperature (which may be the same as or different from the bonding temperature). In some embodiments, this may be performed in a bonder such as a bonding chamber or other bonding station/location used to bond the donor body 100 to the receiver element 110, while in other embodiments, following bonding, the bonded donor body 100 and receiver element 110 may be transferred (e.g., at temperature) to a separate heating chamber, to free the bonder. The separate heating chamber may be a single wafer or batch heating chamber such as an oven, a quartz or belt furnace, another similar heater, etc., and may or may not be coupled to the bonder as described further below with reference to FIGS. 2-3B.

Figure 1C:
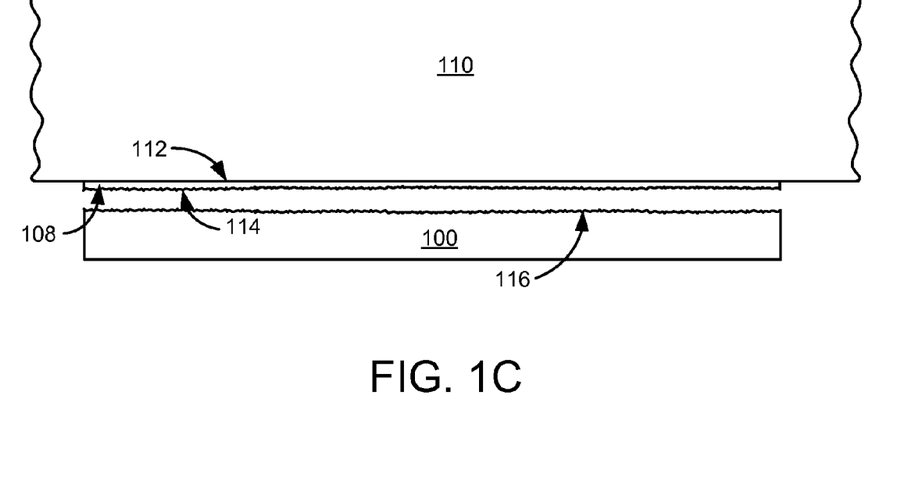
Figure 1D:
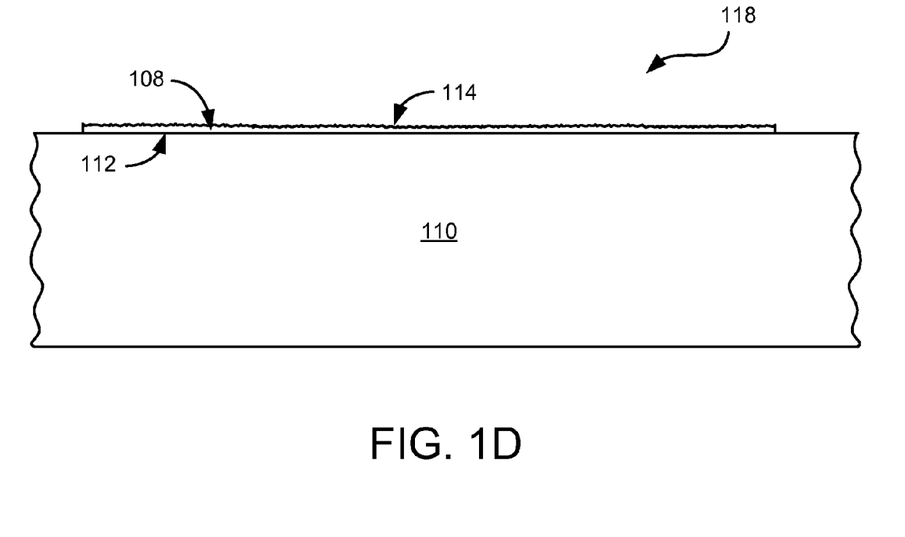

In either case, when the donor body 100 is at the exfoliation temperature, the implanted gas ions 102 (FIG. 1A) migrate to the cleave plane 106, forming bubbles or micro-cracks. The bubbles or micro-cracks expand and merge, resulting in separation of the lamina 108 from the donor body 100. Accordingly, the receiver element 110 and the donor body 100 bonded thereto are maintained at the exfoliation temperature until the lamina 108 separates from the donor body 100 thereby leaving the lamina 108 bonded to the receiver element 110 and forming surface 114 on the lamina 108 and surface 116 on the donor body 100, as illustrated in FIG. 1C. Note that the time required for exfoliation following bonding is reduced by the pre-heating step. Following exfoliation, the resulting assembly 118 (FIG. 1D) may be cooled to ambient temperature and/or otherwise further processed.

In some embodiments, post pre-heating (and/or post bonding) exfoliation may be performed at a temperature in the range from about 350 to about 500° C. for about 2 minutes to about 60 minutes and more preferably at a temperature of about 400 to about 475° C. for about 30 minutes or less. The exfoliation process may be performed in a nitrogen, argon or other inert and/or non-reactive environment.

In some embodiments, the surface 104 of the donor body 100 may be directly bonded to the surface 112 of the receiver element 110, as generally illustrated in FIGS. 1B and 1C, while, in other aspects, one or more conductive layers, adhesive layers, non-conductive layers, or other intermediate layers or combinations of layers may be interposed between the surface 104 of the donor body 100 and the surface 112 of the receiver element 110 (see, for example, FIGS. 4A-E.

Figure 2:
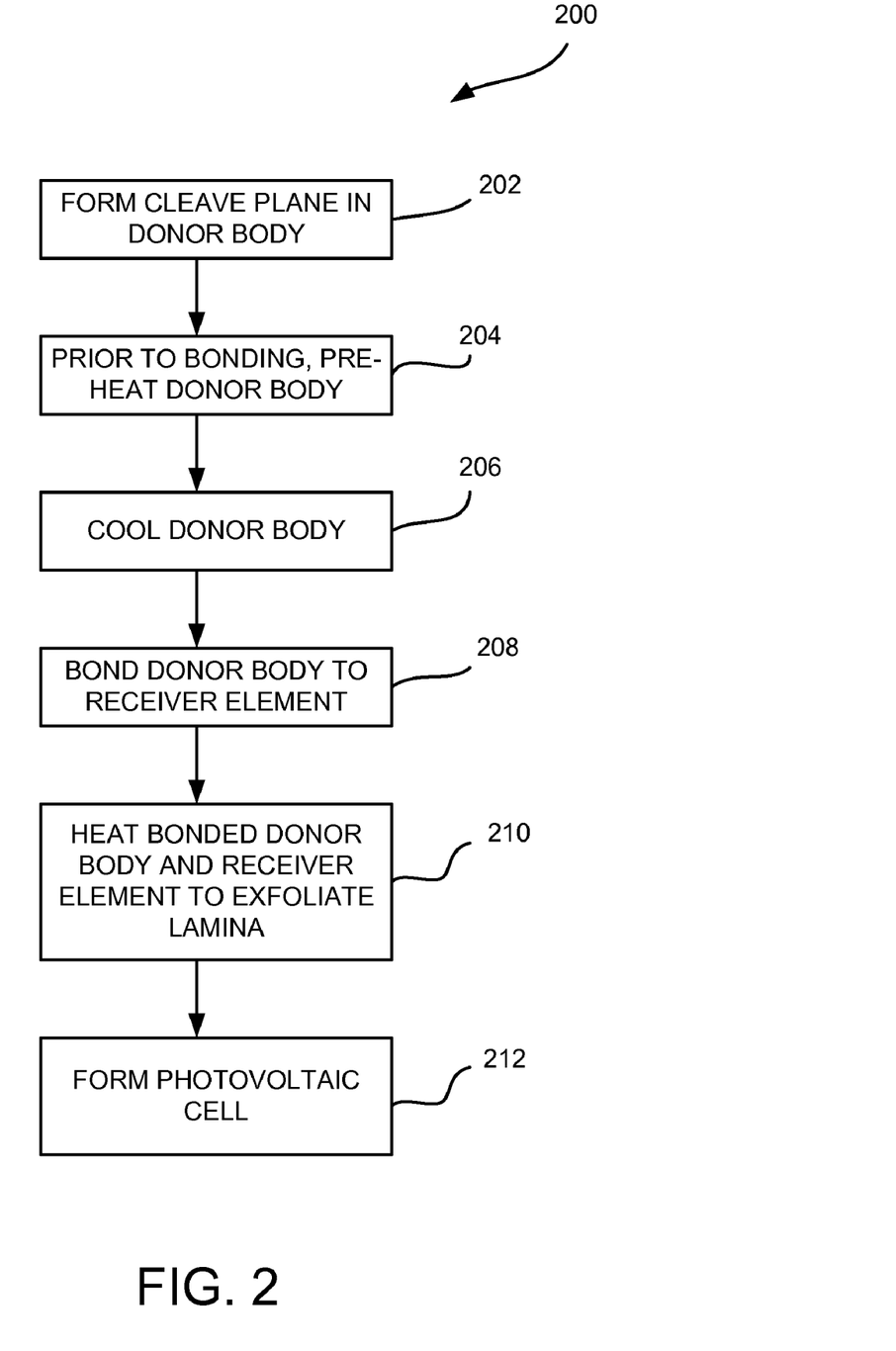
FIG. 2 is a flowchart of an exemplary method for forming a photovoltaic cell in accordance with the present invention.

FIG. 2 is a flowchart of an exemplary method 200 for forming a photovoltaic cell in accordance with the present invention. With reference to FIG. 2, in step 202 a cleave plane is formed in a donor body. For example, hydrogen, helium and/or any other suitable species may be implanted into a donor body such as a semiconductor wafer.

In step 204, the donor body is pre-heated so as to shorten a subsequent post-bonding exfoliation process to be performed on the donor body. For example, in accordance with one or more embodiments of the present invention, at least a portion of the heating process used to exfoliate a lamina from the donor body is performed prior to bonding, outside of a bonder and/or without a receiver element being present. That is, the donor body may be "pre-heated" at an elevated temperature for a time period that is less than the time period required for exfoliation of a lamina from the donor body. The donor body may be pre-heated in a batch chamber, such as a quartz furnace, belt furnace, an oven, etc., with one or more other donor bodies at a temperature and for a time period less than is required for exfoliation of the lamina from the donor body.

A single wafer annealing chamber also may be used. A receiver element need not be present during such a pre-heating step.

Figure 3A:
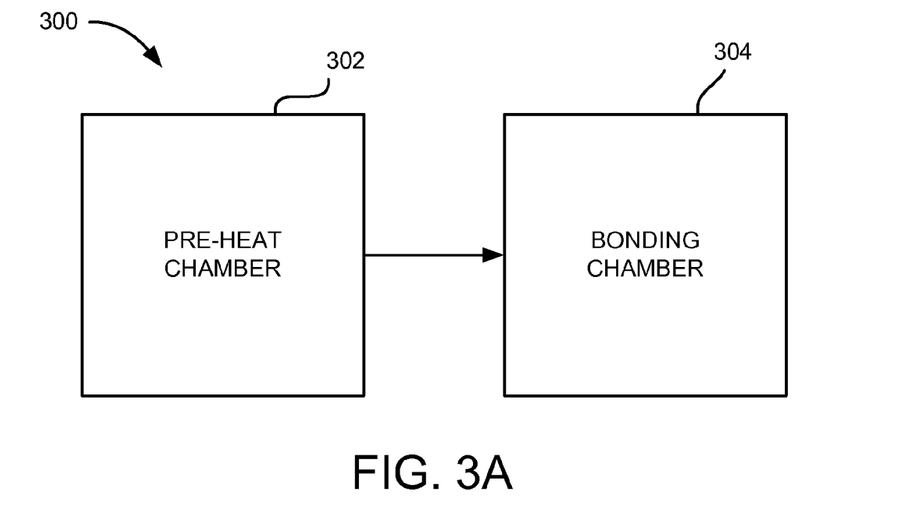
FIG. 3A illustrates a first exemplary exfoliation system provided in accordance with the present invention.

FIG. 3A illustrates a first exemplary exfoliation system 300 provided in accordance with the present invention. The first exfoliation system 300 includes a pre-heating chamber 302 and a bonder 304 (e.g., a bonding chamber or other bonding station/location). The pre-heating chamber 302 may include any chamber suitable for performing an anneal or other heating step such as a batch chamber (e.g., a quartz furnace, belt furnace, an oven, etc.), or a single wafer heating chamber. The bonder 304 may include any suitable bonder such as a bonding chamber or other bonding station or location.

In some embodiments, the pre-heating step may be performed at a temperature in the range from about 350 to about 500° C. for about 5 minutes to about 4 hours and more preferably at a temperature from about 400 to about 475° C. for about 60 minutes or less. The pre-heating step may be performed in air, a nitrogen, argon or other inert and/or non-reactive environment, or any other suitable environment.

In step 206, the donor body is cooled. For example, in some embodiments, the donor body may be cooled (e.g., to room temperature) and removed from the pre-heating chamber 302 for transfer to the bonder 304. In other embodiments, the donor body may be stored (e.g., in a warehouse with other donor bodies, for a day, a week or other time period, etc.). In yet other embodiments, the donor body may be shipped to another location, state, country, etc., for subsequent processing.

In step 208, the donor body is bonded to a receiver element. For example, the donor body may be heated to about a bonding temperature along with a receiver element. In some embodiments, the bonding temperature may be about 350 to about 500° C., and more preferably about 400 to about 475° C. When both the donor body and the receiver element are at about the bonding temperature, the donor body and receiver element may be bonded together using any suitable bonding method (e.g., anodic bonding, thermo-compression, plasma bonding, fusion bonding, plasma-activated fusion bonding, using an adhesive layer, etc.). The receiver element may be bonded to a single donor body, or in some embodiments, the receiver element may be a large panel to which multiple donor bodies may be bonded.

Figure 3B:
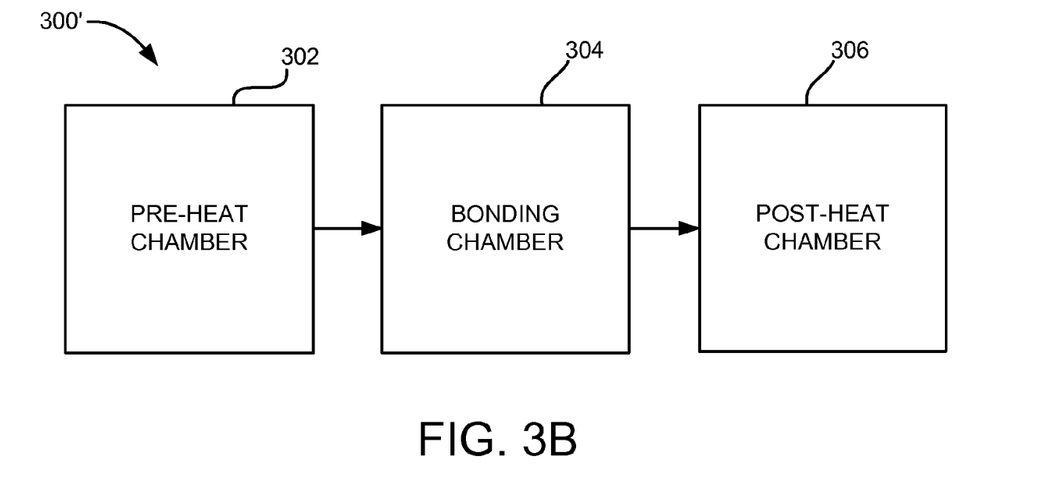
FIG. 3B illustrates a second exemplary exfoliation system provided in accordance with the present invention.

In step 210, the bonded donor body and receiver element are heated to complete the exfoliation of a lamina from the donor body. In some embodiments, the bonded donor body and receiver element may remain in the bonder used to bond the donor body to the receiver element (e.g., and heated at the same or a different temperature than was used for bonding). Such embodiments may be performed in the system 300 of FIG. 3A, for example. In an alternative embodiment, the bonded donor body and receiver element may be transferred (e.g., at temperature) to a post-heating chamber to complete exfoliation of a lamina from the donor body. For example, FIG. 3B illustrates a second exemplary exfoliation system 300' provided in accordance with the present invention. The second exfoliation system 300' of FIG. 3B is similar to the first exfoliation system 300 of FIG. 3A, but includes an additional post-heating chamber 306 for heating the bonded donor body and receiver element. The post-heating chamber 306 may include any chamber suitable for performing an anneal or other heating step such as a batch chamber (e.g., a quartz or belt furnace, an oven, etc.), or a single wafer heating chamber. In some embodiments, the post-heat chamber 306 may be coupled to the bonder 304, such as directly or via a transfer chamber (not separately shown) that allows the bonded donor body and receiver element to be transferred between the bonder 304 and post-heat chamber 306 in a suitable environment and/or at temperature (if needed).

In either case, when the donor body is at an exfoliation temperature, implanted gas ions migrate to the implant-defined cleave plane within the donor body, forming bubbles or micro-cracks. The bubbles or micro-cracks expand and merge, resulting in separation of the lamina from the donor body. Accordingly, the receiver element and the donor body bonded thereto are maintained at an exfoliation temperature until the lamina separates from the donor body thereby leaving the lamina bonded to the receiver element.

In some embodiments, post-bonding exfoliation may be performed at a temperature in the range from about 350 to about 500° C. for about 2 minutes to about 60 minutes and more preferably from about 400 to about 475° C. for about 60 minutes or less.

In one or more embodiments, the donor body may be pre-heated (step 204) to a higher temperature than is used during post-bonding exfoliation of the lamina from the bonded donor body and receiver element (step 210). Further, in some embodiments, the time period for pre-heating the donor body (step 204) may be at least as long as the time period for post-bonding exfoliation (step 210). In one particular embodiment, the time period for pre-heating the donor body (step 204) may be at least 3 times, and more preferably at least 6 times, as long as the time period for post-bonding exfoliation (step 210). Other relationships between pre-heating and post-bonding exfoliation times may be used. In some embodiments, the pre-heating step may be performed for a shorter time period than is used for post-bonding exfoliation. In general, the time period for the pre-heating step versus post-bonding exfoliation will depend on the temperature employed for each.

In step 212, a photovoltaic cell is formed from the bonded lamina and receiver element. Exemplary photovoltaic cells are described below with reference to FIGS. 4A-8. However, other photovoltaic cells may be formed from the bonded lamina and receiver.

Exemplary Photovoltaic Cell: Rear Local Contact

FIGS. 4A-E are cross sectioned views illustrating formation of a photovoltaic cell in accordance with the present invention. The process begins with a donor body 400 of an appropriate semiconductor material. An appropriate donor body may be a monocrystalline silicon wafer of any practical thickness, for example from about 200 to about 1000 microns thick.

In alternative embodiments, the wafer may be thicker; maximum thickness is limited only by practicalities of wafer handling. Alternatively, polycrystalline or multicrystalline silicon may be used, as may microcrystalline silicon, or wafers or ingots of other semiconductors materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

A top surface 402 of the donor body 400 may be textured to cause light that passes through a photovoltaic cell fabricated from the donor body 400 to be internally reflected or "trapped" within the photovoltaic cell, thus improving cell efficiency. For example, commonly assigned Herner, U.S. patent application Ser. No. 12/343,420, filed Dec. 23, 2008, titled "METHOD TO TEXTURE A LAMINA SURFACE WITHIN A PHOTOVOLTAIC CELL", which is hereby incorporated by reference herein in its entirety for all purposes, describes a method for texturing one or more surfaces of a donor body Turning to FIG. 4B, in the present example, a heavily doped region 404 is formed by any suitable doping method, for example by diffusion doping. In the present example, heavily doped region 404 is p-doped, opposite the conductivity type of the bulk of donor body 400, creating a p-n junction. Doping may alternatively be performed by other methods, for example deposition and anneal of a doped oxide such as borosilicate glass. Next, a dielectric 406 is formed on the first surface 402. As will be seen, in the present example, the first surface 402 will be the back of the completed photovoltaic cell, and a reflective, conductive material is to be formed on the dielectric layer 406. The reflectivity of the conductive layer to be formed is enhanced if dielectric layer 406 is relatively thick. For example, if dielectric layer 406 is silicon dioxide, it may be between about 1000 and about 1500 angstroms thick, while if dielectric layer 406 is silicon nitride, it may be between about 700 and about 800 angstroms thick, for example about 750 angstroms. This layer may be grown or deposited. A grown oxide or nitride layer 406 passivates first surface 402 better than if this layer is deposited. In some embodiments, a first thickness of layer 406 may be grown, while the rest is deposited. As shown, the texture at first surface 402 is translated to the surface of layer 406.

Figure 4A:
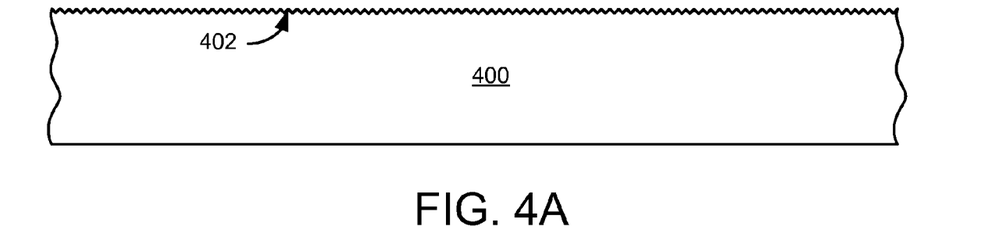
FIGS. 4A-4E are cross-sectional views showing stages in fabrication of a photovoltaic cell formed according to methods of the present invention.
Figure 4B:
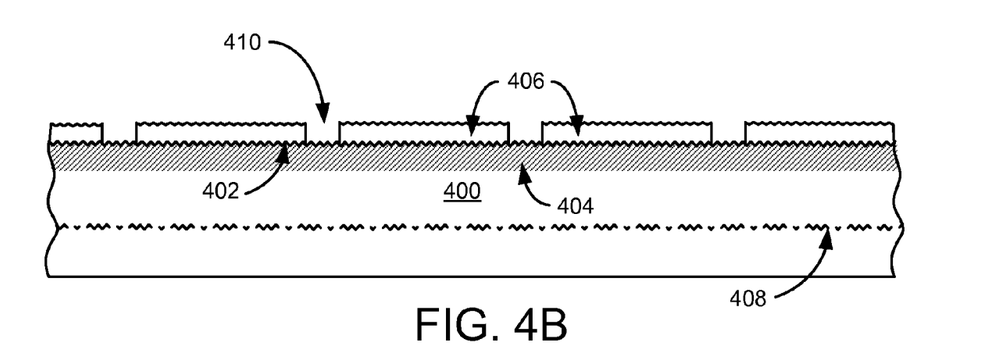

In the next step, ions, preferably hydrogen or a combination of hydrogen and helium, are implanted through dielectric layer 406 into donor body 400 to define a cleave plane 408 as described earlier. The cost of this hydrogen or helium implant may be kept low by methods described in Parrill et al., U.S. patent application Ser. No. 12/122,108, "Ion Implanter for Photovoltaic Cell Fabrication," filed May 16, 2008, owned by the assignee of the present invention and hereby incorporated by reference herein in its entirety for all purposes. This implant is conformal, so any texture at the point of entry of the implanted ions at the surface of layer 406 is reproduced in cleave plane 408. The overall depth of cleave plane 408 is determined by several factors, including implant energy. In some embodiments, the depth of cleave plane 408 can be between about 0.2 and about 100 microns from first surface 402, for example between about 0.5 and about 20 or about 50 microns, for example between about 1 and about 10 microns or between about 1 or 2 microns and about 5 microns.

After implant, openings 410 are formed in dielectric 406 by any appropriate method, for example by laser scribing or screen printing. The size of openings 410 may be as desired, and will vary with dopant concentration, metal used for contacts, etc. In one embodiment, these openings may be about 40 microns square.

Figure 4C:
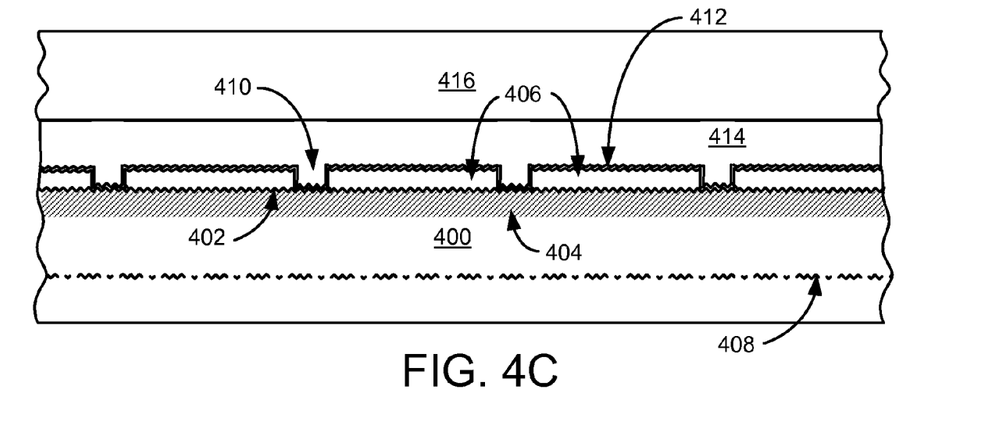

Turning to FIG. 4C, a layer 412 of a conductive barrier material is deposited next on dielectric layer 406, filling openings 410 and contacting heavily doped region 404 at first surface 402. Possible materials for this layer include tantalum, titanium, titanium nitride, or a stack of appropriate materials, for example titanium and titanium nitride. Barrier layer 412 may be, for example, about 1000 angstroms thick or more. Next a layer 414 of a conductive material is formed, for example aluminum, silver, copper, titanium, chromium, molybdenum, tantalum, zirconium, vanadium, indium, cobalt, antimony, or tungsten, or alloys thereof. Conductive layer 414 may be a stack of conductive materials. In one embodiment, conductive layer 414 is a thick layer, for example about three microns, of aluminum. Barrier layer 412 serves to prevent reaction between conductive layer 414 and silicon, which may contaminate the lamina to be formed and compromise cell efficiency. In some embodiments, barrier layer 412 may be omitted. Other barrier and/or conductive layer materials and/or thicknesses may be used.

As stated above, in accordance with one or more embodiments of the present invention, at least a portion of the heating process used to exfoliate a lamina from the donor body 400 may be performed prior to bonding, outside of a bonder and/or without a receiver element being present. That is, the donor body 400 may be "pre-heated" at an elevated temperature for a time period that is less than the time period required for exfoliation of a lamina from the donor body 400. The donor body 400 may be pre-heated in a batch chamber, such as a quartz or belt furnace, an oven, etc., with one or more other donor bodies at a temperature and for a time period less than is required for exfoliation of the lamina from the donor body 400. A single wafer annealing chamber also may be used. In general, such pre-heating may be performed at any time after implant but before bonding. In some embodiments, multiple pre-heating steps may be performed at different times (or locations) after implant. The same or different time periods and/or temperatures may be employed for the pre-heating steps. Layers that intervene between the lamina and a receiver element in the finished cell may be deposited before or after pre-heat, for example.

In some embodiments, the pre-heating step may be performed at a temperature in the range from about 350 to about 500° C. for about 5 minutes to about 4 hours and more preferably at a temperature from about 400 to about 475° C. for about 60 minutes or less. The pre-heating step may be performed in air, a nitrogen, argon or other inert and/or non-reactive environment or any other suitable environment. In general, the pre-heating step may be performed any time after implant and prior to bonding; and the temperature used during pre-heating may be adjusted for the materials present on the donor body. For example, if aluminum or another material having a low melting temperature is employed, the temperature of the pre-heating step may be selected so as to be below such melting temperature.

Next, donor body 400 is affixed to a receiver element 416, with dielectric layer 406, conductive barrier layer 412, and conductive layer 414 intervening. Receiver element 416 may be any suitable material, including glass, such as soda-lime glass or Pyrex; a metal or metal alloy such as stainless steel or aluminum; a polymer; or a semiconductor, such as metallurgical grade silicon. The donor body 400, receiver element 416, and intervening layers are bonded by any suitable method (e.g., anodic bonding, thermo-compression, plasma bonding, fusion bonding, plasma-activated fusion bonding, using an adhesive layer, etc.). If receiver element 416 is soda-lime glass, anodic bonding may be advantageous. In some embodiments, receiver element 416 has a widest dimension no more than about twenty percent greater than the widest dimension of donor body 400, and in some embodiments the widest dimension may be about the same as that of donor body 400. In other embodiments, the receiver element 416 may be a large panel to which multiple donor bodies may be bonded.

Figure 4D:
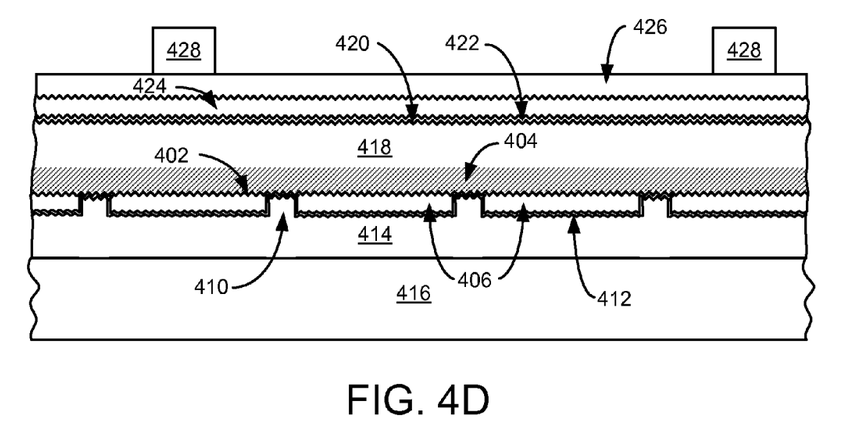

Referring to FIG. 4D, which shows the structure inverted with receiver element 416 on the bottom, a post-bonding thermal step causes lamina 418 to cleave from donor body 400 at the cleave plane 408. In some embodiments, this cleaving step may be combined with a bonding step. Cleaving is achieved in this example by exfoliation, which may be achieved at temperatures between, for example, about 350 and about 650 degrees C. In general exfoliation proceeds more rapidly at higher temperature. Exfoliation temperatures below 600 degrees C, for example between about 450 and 550 degrees C, may reduce unwanted dopant diffusion. The thickness of lamina 418 is determined by the depth of cleave plane 408. In some embodiments, the thickness of lamina 418 is between about 1 and about 10 microns, for example between about 2 and about 5 microns. As stated, the length of time required for post-bonding exfoliation may be significantly decreased by pre-heating the donor body 400 after implant.

Second surface 420 has been created by exfoliation. As shown, the texture created at first surface 402 has been translated to second surface 420. In some embodiments, this texture will be sufficient for the completed cell. In other embodiments, an additional texturing step may be performed at second surface 420.

After cleaning, a thin layer 422 of intrinsic amorphous silicon is deposited on second surface 420. Layer 422 may be, for example, about 50 angstroms thick. In some embodiments intrinsic amorphous layer 422 may be omitted. A layer 424 of heavily doped amorphous silicon is formed on layer 422, and may be, for example, about 300 angstroms thick. In general, the combined thickness of layers 422 and 424 will be between about 200 and about 500 angstroms, for example about 350 angstroms. Both amorphous silicon layers 422 and 424 are formed by any convention method, for example plasma enhanced chemical vapor deposition (PECVD). In this example, heavily doped amorphous layer 424 is doped n-type, the same conductivity type as lightly doped lamina 418. Amorphous layer 424 provides an electrical contact to the photovoltaic cell being formed. This PECVD step can be performed at relatively low temperature, allowing some low-cost materials which cannot tolerate high temperatures, such as soda-lime glass, to be used as the receiver element 416. Keeping temperature low further facilitates the use of aluminum in conductive layer 414. Aluminum has a relatively low melting point and will flow and deform with exposure to excessive temperature.

In this embodiment, recall that heavily doped region 404, formed at first surface 402, was doped with a p-type dopant, opposite the conductivity type of the n-doped body of lamina 418, forming a p-n junction, such that region 404 behaves as the emitter of the cell, while amorphous layer 424 is doped to the same conductivity type, providing electrical contact to the cell. In an alternative embodiment, heavily doped region 404 can be doped to the same conductivity type as the body of lamina 418, while heavily doped amorphous layer 424 is doped to the opposite conductivity type. In this case, heavily doped region 404 provides electrical contact to the cell, while heavily doped amorphous layer 424 serves as the emitter. In both embodiments, the lightly doped body of lamina 418 serves as the base of the cell. In all embodiments described, the conductivity types can be reversed.

A transparent conductive oxide (TCO) layer 426 is formed on heavily doped amorphous layer 424. Appropriate materials for TCO 426 include aluminum-doped zinc oxide, as well as indium tin oxide, tin oxide, titanium oxide, etc.; this layer may serve as both a top electrode and an antireflective layer. In alternative embodiments, an additional antireflective layer (not shown) may be formed on top of TCO 426. Finally, in some embodiments wiring 428 is formed on TCO 426 by any suitable method. Wiring 428 may be formed of, for example, aluminum screen print paste and fired at low temperature.

Figure 4E:
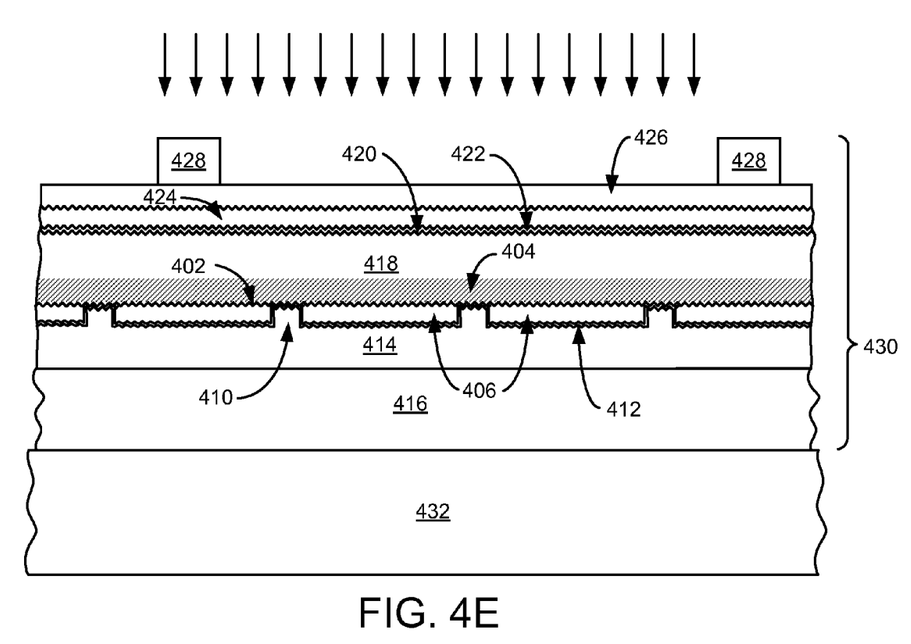

FIG. 4E shows completed photovoltaic assembly 430 which includes lamina 418 and receiver element 416, and includes a completed photovoltaic cell. Photovoltaic assembly 430, along with a plurality of other photovoltaic assemblies 430, can be mounted on substrate 432, as shown, forming a photovoltaic module. In an alternative embodiment, photovoltaic assemblies 430 can be affixed to a transparent superstrate, not shown. Incident light, as indicated by arrows, enters lamina 418 at second surface 420, and, after traveling through lamina 418, is reflected back into lamina 418 at first surface 402. The photovoltaic cells of the photovoltaic assemblies 430 can be connected electrically in series, for example using the methods described in Petti et al., "Front Connected Photovoltaic Assembly," U.S. patent application Ser. No. 12/331,376, filed Dec. 9, 2008, owned by the assignee of the present application and hereby incorporated by reference herein in its entirety for all purposes. More detailed examples of fabrication of a photovoltaic cell in which the receiver element serves as a superstrate are provided in Sivaram et al. and Herner U.S. Ser. No. 12/057,265, earlier incorporated.

The foregoing description discloses only exemplary embodiments of the invention. Modifications of the above disclosed apparatus and methods which fall within the scope of the invention will be readily apparent to those of ordinary skill in the art. For instance, detailed methods of fabrication have been described herein, but any other methods that form the same structures can be used while the results fall within the scope of the invention. While the present invention has been described primarily with regard to the formation of photovoltaic cells, it will be understood that the novel pre-heating methods may be employed during the formation of other device structures such as microelectrocmechanical systems (MEMS), silicon-on-insulator (SOI) devices, and the like. In both MEMS or SOI devices the exfoliation time after bonding may be reduced if a donor body (e.g., a wafer) has been pre-heated as described herein. Accordingly, while the present invention has been disclosed in connection with exemplary embodiments thereof, it should be understood that other embodiments may fall within the spirit and scope of the invention, as defined by the following claims.

The invention claimed is:

1. A method comprising:
   forming a cleave plane in a donor body so as to define a lamina to be bonded to a receiver element and exfoliated from the donor body;
   after forming the cleave plane, pre-heating the donor body in a first chamber in an inert environment for a first time period that is less than a time period required for exfoliation of the lamina from the donor body, wherein the first chamber is a batch chamber capable of pre-heating two or more donor bodies at once, wherein pre-heating is performed at a temperature in the range from about 350 to about 500° C.;
   after pre-heating the donor body, heating the donor body and the receiver element in a second chamber;

bonding the donor body to the receiver element within the second chamber; and heating the bonded donor body and receiver element for a second time period so as to complete the exfoliation of the lamina from the donor body;

wherein the first time period is from about 5 minutes to about 4 hours and wherein the second time period is from about 2 to about 60 minutes.

2. The method of claim 1 wherein heating the bonded donor body and receiver element is performed in the second chamber.

3. The method of claim 1 wherein heating the bonded donor body and receiver element is performed in a third chamber.

4. The method of claim 1 and wherein at least one of bonding and heating the bonded donor body and receiver element is performed at a temperature in the range of about 400 to about 475° C.

5. A method of forming a photovoltaic cell, the method comprising:

providing a semiconductor donor body;

implanting a species into the donor body so as to form a cleave plane in the donor body, the cleave plane defining a lamina to be bonded to a receiver element and exfoliated from the donor body;

after the implanting step, pre-heating the donor body in an inert environment in a first chamber, wherein the first chamber is a batch chamber capable of pre-heating two or more donor bodies at once, for a first time period that is less than a time period required for exfoliation of the lamina from the donor body;

after pre-heating the donor body, heating the donor body and the receiver element in a second chamber;

bonding the donor body to the receiver element within the second chamber; and heating the bonded donor body and receiver element for a second time period so as to complete the exfoliation of the lamina from the donor body;

wherein the first time period is at least as long as the second time period.

6. The method of claim 5 further comprising fabricating the photovoltaic cell using at least a portion of the lamina.

7. The method of claim 5 wherein the first time period is at least three times as long as the second time period.

8. The method of claim 7 wherein the first time period is at least six times as long as the second time period.

9. The method of claim 5 wherein preheating is performed at a first temperature and heating the bonded donor body and receiver element is performed at a second temperature that is less than or equal to the first temperature.

* * * * *

UNITED STATES PATENT AND TRADEMARK OFFICE
CERTIFICATE OF CORRECTION

PATENT NO. : 7,754,519 B1  
APPLICATION NO. : 12/465351  
DATED : July 13, 2010  
INVENTOR(S) : Robert D. Tolles It is certified that error appears in the above-identified patent and that said Letters Patent is hereby corrected as shown below:

In column 13, line 16, delete "and".

Signed and Sealed this

Thirty-first Day of August, 2010

David J. Kappos  
*Director of the United States Patent and Trademark Office*